(12) United States Patent
Cook et al.

(10) Patent No.: US 7,238,429 B2
(45) Date of Patent: Jul. 3, 2007

(54) ULTRA-HARD LOW FRICTION COATING BASED ON AlMGB$_{14}$ FOR REDUCED WEAR OF MEMS AND OTHER TRIBOLOGICAL COMPONENTS AND SYSTEM

(75) Inventors: Bruce Allan Cook, Ankeny, IA (US); Yun Tian, Ames, IA (US); Joel Lee Harringa, Ames, IA (US); Alan Paul Constant, Ames, IA (US); Alan Mark Russell, Ames, IA (US); Palaniappa A. Molian, Ames, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 0 days.

(21) Appl. No.: 10/946,051

(22) Filed: Sep. 21, 2004

(65) Prior Publication Data

US 2005/0100748 A1     May 12, 2005

Related U.S. Application Data

(60) Provisional application No. 60/505,366, filed on Sep. 23, 2003.

(51) Int. Cl.
- *B32B 15/20* (2006.01)
- *C23C 14/34* (2006.01)
- *C23C 14/16* (2006.01)
- *C22C 21/00* (2006.01)

(52) U.S. Cl. ............. 428/650; 428/652; 428/938; 204/192.16; 427/250; 427/554

(58) Field of Classification Search ........... 428/650; 427/597
See application file for complete search history.

(56) References Cited

U.S. PATENT DOCUMENTS 6,099,605 A    8/2000  Cook et al.
6,432,855 B1   8/2002  Cook et al.
2003/0219605 A1* 11/2003 Molian et al. ............ 428/422

FOREIGN PATENT DOCUMENTS

WO    WO 03/068503 A1 * 8/2003

OTHER PUBLICATIONS

Molian, Pal., et al., "Nanocrystalline Thin Films of New Ultra-hard Borides for MEMS and Tooling Applications (DMI-0084969)," Manuscript not published 2003; 10 pages; no date given.*

(Continued)

*Primary Examiner*—John J. Zimmerman
(74) *Attorney, Agent, or Firm*—McKee, Voorhees & Sease, P.L.C.

(57) ABSTRACT

Performance and reliability of microelectromechanical system (MEMS) components enhanced dramatically through the incorporation of protective thin film coatings. Current-generation MEMS devices prepared by the LIGA technique employ transition metals such as Ni, Cu, Fe, or alloys thereof, and hence lack stability in oxidizing, corrosive, and/or high temperature environments. Fabrication of a superhard, self-lubricating coating based on a ternary boride compound AlMgB$_{14}$ is described in this letter as a potential breakthrough in protective coating technology for LIGA microdevices. Nanoindentation tests show that hardness of AlMgB$_{14}$ films prepared by pulsed laser deposition ranges from 45 GPa to 51 GPa, when deposited at room temperature and 573 K, respectively. Extremely low friction coefficients of 0.04-0.05, which are thought to result from a self-lubricating effect, have also been confirmed by nanoscratch tests on the AlMgB$_{14}$ films. Transmission electron microscopy studies show that the as-deposited films are amorphous, regardless of substrate temperature; however, analysis of FTIR spectra suggests that the higher substrate temperature facilitates formation of the B$_{12}$ icosahedral framework, therefore leading to the higher hardness.

14 Claims, 6 Drawing Sheets

OTHER PUBLICATIONS

U.S. Appl. No. 60/367,338, filed Feb. 14, 2002.*

Cherukuri, Ram, et al. "Pulsed laser deposition of AlMgB$^{14}$ on carbide insets for metal cutting" Surface and Coatings Technology 155 (2002) 112-120, no month given.

Molian, Pal., et al. Nanocrystalline Thin Films of New Ultra-hard Borides for MEMS and Tooling Applications (DMI-0084969), Manuscript not published 2003 (10 pages); no date given.

Prasad, Somuri, et al. "Tribological coatings for LIGAMENS" Advanced Materials & Processes, Dec. 2002, pp. 30-33.

* cited by examiner

ULTRA-HARD LOW FRICTION COATING BASED ON AlMGB₁₄ FOR REDUCED WEAR OF MEMS AND OTHER TRIBOLOGICAL COMPONENTS AND SYSTEM

CROSS-REFERENCE TO RELATED APPLICATIONS

This application is a conversion of U.S. Provisional Application No. 60/505,366, filed Sep. 23, 2003, which is herein incorporated by reference in its entirety.

GRANT REFERENCE

Work for this invention was federally funded under DOE Contract No. W-7405-Eng-82, and NSF-DMI-0084969. The Government may have certain rights in this invention.

BACKGROUND OF THE INVENTION

Microelectromechanical Systems (MEMS) are among the most significant technological advances of the last two decades. Bulk micromachining and surface micromachining have become primary processing techniques for fabrication of MEMS devices derived from Si and Si-based materials. However, there is a major drawback associated with the bulk and surface micromachining: low geometric aspect ratio, which severely limits their further applications. To meet the critical need for high-aspect-ratio microdevices, the LIGA (LIthographie-Galvanoformung-Abformung) technique, based on deep X-ray lithography and electroplating, has been developed and studied. The LIGA process is capable of producing microdevices a few centimeters high with an aspect ratio of more than 100, which is particularly advantageous for microdevices such as micromotors and micropumps since the high aspect ratios allow the generation of high torque. In addition, the LIGA process also allows one to use conventional materials such as metals for the MEMS architectures.

It is increasingly important to fabricate LIGA microdevices capable of operating in harsh environments, such as high contact stresses (microgear sets), high temperatures (microcombustion chambers), and corrosive environments (microheat exchangers or microcatalytic converters). Nonetheless, most LIGA microdevices are manufactured out of Ni, Cu, Fe or their alloys, whose performance would be significantly degraded in these demanding situations, even to the extent of total failure. Recently, surface treatment by coatings has been recognized as an effective method to alleviate this serious problem and substantially prolong the lifetime of LIGA microdevices. The characteristics of an ideal protective coating for LIGA microdevices are: low wear rate, low coefficient of friction, low thermal conductivity, strong adhesion, chemical inertness, and high temperature stability. Protective coatings with the potential to form a lubricating film on their surfaces (self-lubricating) are particularly desirable for reducing friction and wear in LIGA microdevices.

Diamond-like carbon (DLC) films have been explored for this use, however, a high compressive residual stress of several GPa usually develops in DLC films, causing delamination of films with thickness of greater than 100 nm. Moreover, DLC films are thermally unstable at temperatures above 723 K, which render them unsuitable for high temperature applications. Low-surface-energy, hydrophobic polymeric coatings are promising for minimizing stiction and friction, but they do not improve the wear resistance of LIGA microdevices because of their comparatively low hardness, and they fail at temperatures only moderately higher than ambient.

SUMMARY OF THE INVENTION

The invention is a new superhard AlMgB₁₄ film, which serves as an excellent protective coating for LIGA microdevices, and Si-based MEMS components, due to its extremely high hardness, exceptionally low coefficient of friction (provided by self-lubricant), and strong adhesion to a wide range of substrate materials.

DETAILED DESCRIPTION OF THE PREFERRED EMBODIMENT

Figure 1:
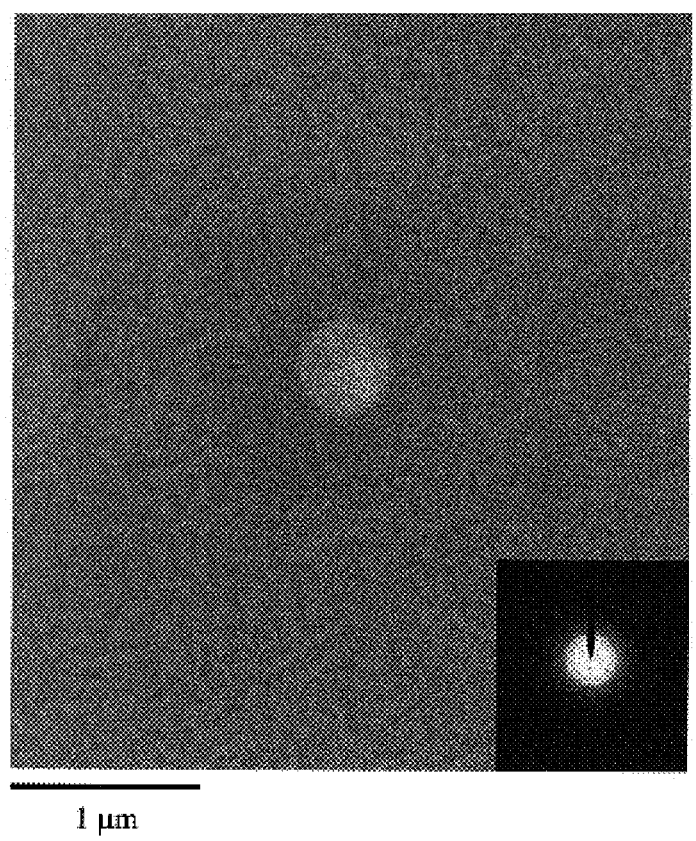
FIG. 1 is a plan-view bright field TEM image of $Al_{0.95}Si_{0.05}MgB_{14}$ film deposited on a grid heated to 573 K.

The disclosure of our previous U.S. Pat. No. 6,099,605 issued Aug. 8, 2000 is incorporated herein by reference, in all respects. The basic ceramic alloy used is an orthorhombic boride, $AlMgB_{14}$. An $AlMgB_{14}$-based alloy includes $AlMgB_{14}$, $Al_zSi_{1-z}MgB_{14}$, $AlCr_zMg_{1-z}B_{14}$, $AlTi_zMg_{1-z}B_{14}$ and $AlMgB_{14}X$ where X in present is an amount of from 5 wt. % to 30 wt. % and comprises a doping agent selected from the group consisting of Group III, IV and V elements and borides and nitrides thereof and where $1 \geq z \geq 0$. An $AlMgB_{14}$-based alloy includes composites formed from the above compounds and Co—Mn.

$AlMgB_{14}$-based films were prepared on Si (100) and carbon-coated copper grids using pulsed laser deposition (PLD) at room temperature and 573 K. Alternatively, sputtering may be used to deposit the films. Crystallographic studies indicate that the metal sites are not fully occupied in the lattice so that the true chemical formula may be closer to $Al_{0.75}Mg_{0.78}B_{14}$ which is contemplated by the formula here used as $AlMgB_{14}$. The base pressure was maintained below $8 \times 10^{-7}$ Torr. A low base pressure keeps oxygen out of the system. The spinel, $MgAl_2O_4$ forms with oxygen present. The films of the present invention contain less than 10 mol. % O, preferably less than 5 mol. % O. Hot-pressed $Al_{0.95}Si_{0.05}MgB_{14}$ was used as the target. Silicon doping in the $AlMgB_{14}$ system was accomplished by calculating the nominal masses of the individual elements, assuming the Si atoms substitute for Al in the boride lattice. The chemical representation for the Si-doped compositions is given by the following:

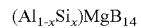

where x is typically equal to 0.05, although a range of silicon substitutions is possible. The constituent elements are weighed out in an inert atmosphere glove box and placed in a reaction vessel, which is subsequently sealed to prevent oxygen contamination. The reaction mechanism, typically high energy comminution, reduces particle size and facilitates interdiffusion between the components, thereby forming the desired alloy. The microstructure of $Al_{0.95}Si_{0.05}MgB_{14}$ films deposited on carbon-coated copper grids was examined directly with a Philips CM30transmission electron microscope (TEM) operated at 300 kV. A Bruker IFS 66v/S Fourier transform infrared (FTIR) spectrometer was employed to extract local bonding information. Surface roughness of the films was measured by a Digital Instruments Dimension 3100 atomic force microscope (AFM), the root mean square roughness was obtained over a scanning area of 300×300 nm. Nanoindentation with Hysitron Triboindentor and a diamond cube corner tip (radius<100 nm) was performed on the films to obtain the hardness and elastic moduli of the films as a function of the indentation depth, and the coefficient of friction was determined by a nanoscratch method with a conical diamond tip (radius=1 μm), the sliding speed was set at 133 nm/s under a load of 10-100 μN, the sliding distance was 4 μm.

FIG. 1 shows a plan-view bright field TEM image of $Al_{0.95}Si_{0.05}MgB_{14}$ film deposited on a grid heated to 573 K. The selected area diffraction pattern (SADP) from this film is presented in the inset, in which a halo (diffuse) ring pattern is clearly evident. Furthermore, static and conical dark field images do not show any nanocrystalline structure, indicating that the film is primarily amorphous. Small particles are occasionally observed in the film. It is rather interesting to note that the film exhibits a maze pattern; an EDS study showed a homogeneous film composition across the bright and dark stripes. It was therefore speculated that the observed maze pattern might be caused by variation in film thickness, which is believed to be a consequence of non-uniform contraction of the $Al_{0.95}Si_{0.05}MgB_{14}$ film upon cooling from 573 K due to thermal expansion mismatch between the Cu grid and amorphous $Al_{0.95}Si_{0.05}MgB_{14}$ film. The TEM image and SADP of $Al_{0.95}Si_{0.05}MgB_{14}$ film deposited at room temperature are similar to those of 573 K-deposited $Al_{0.95}SiO_{0.05}MgB_{14}$ film except that the former does not show any maze pattern, indicative of the amorphous structure in this film.

Figure 2:
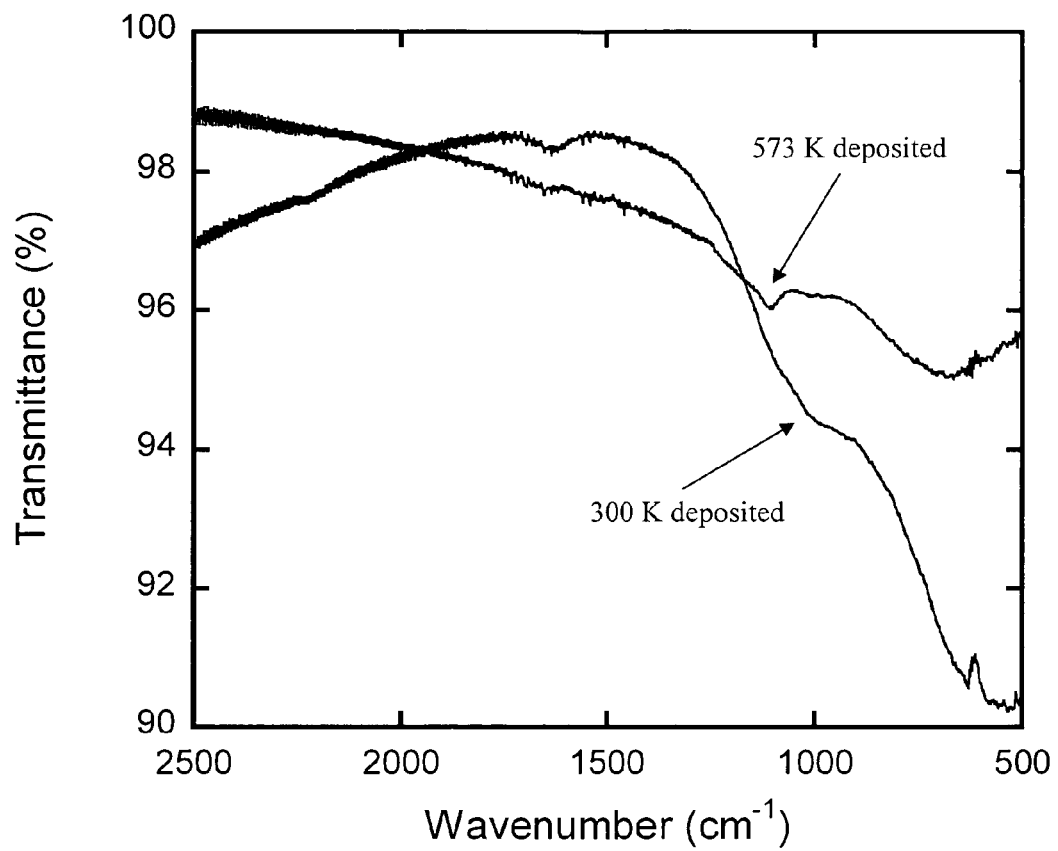
FIG. 2 is the Fourier-Transform infrared spectra of $Al_{0.95}Si_{0.05}MgB_{14}$ films deposited at two different substrate temperatures.

FIG. 2 shows the Fourier-Transform infrared (FTIR) spectra of $Al_{0.95}Si_{0.05}MgB_{14}$ films deposited at the two different substrate temperatures. Because of the minimal thickness of the films, measurements were performed in transmission mode, so that the films would not need to be physically removed from the substrates. The transmission characteristics of the Si substrate are well known and corrected for in the results. For the room temperature-deposited $Al_{0.95}Si_{0.05}MgB_{14}$ film, it can be seen that there is a weak absorption in the vicinity of 1000 cm$^{-1}$, which could be assigned to an overlapping of $A_{2u}$ and $E_u$ vibrational modes of a single $B_{12}$ icosahedron. The low absorption intensity indicates that the $B_{12}$ icosahedron was not fully developed at this deposition temperature. For the $Al_{0.95}Si_{0.05}MgB_{14}$ film deposited at 573 K, however, a stronger absorption is observed at ~1100 cm$^{-1}$, which can be ascribed to the $F_{1u}$ vibrational mode of a single $B_{12}$ icosahedron (Werheit et al., J. Alloys Compd., 202, 269 (1993)). This is a breathing mode characterized by two half-icosahedra vibrating against each other. The strong absorption intensity suggests that well-formed $B_{12}$ icosahedra are present in the 573 K-deposited $Al_{0.95}Si_{0.05}MgB_{14}$ film.

Figure 3A:
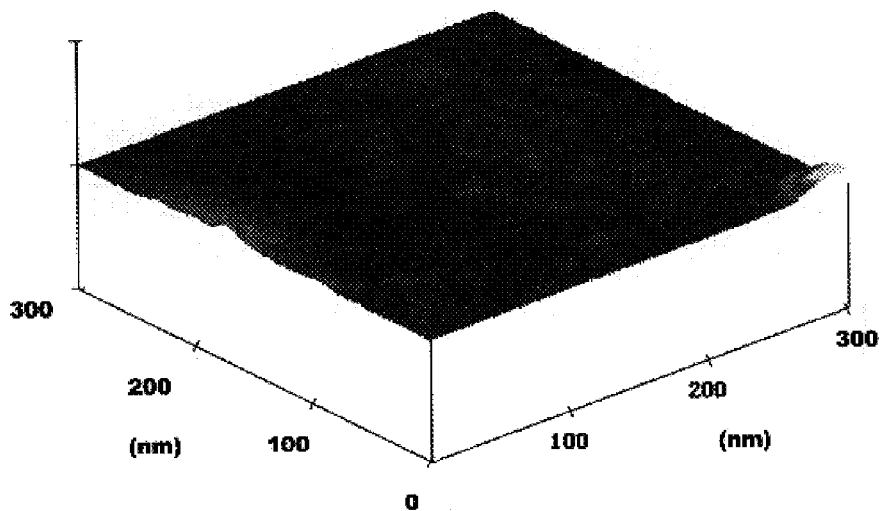
FIGS. 3A and 3B show the AFM images of $Al_{0.95}Si_{0.05}MgB_{14}$ films deposited on Si(100) at room temperature and 573 K, respectively.
Figure 3B:
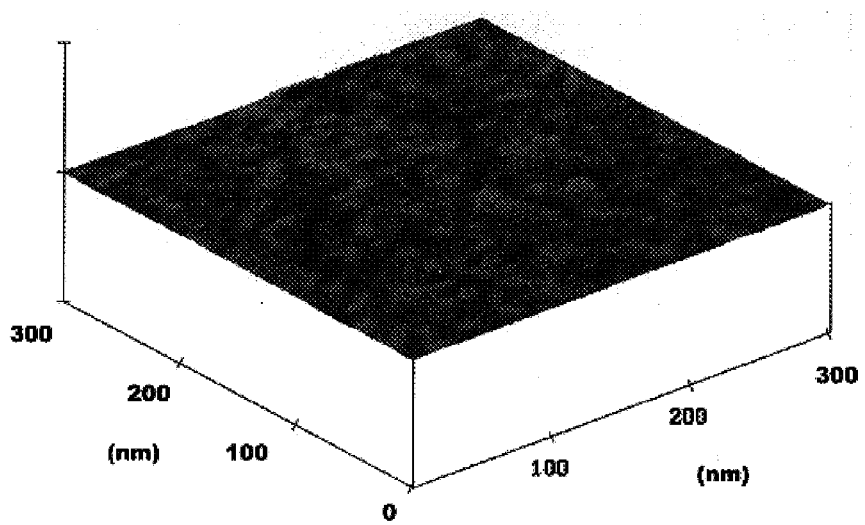

FIGS. 3A and 3B show the AFM images of $Al_{0.95}Si_{0.05}MgB_{14}$ films deposited on Si(100) at room temperature and 573 K, respectively. This figure illustrates that smooth $Al_{0.95}Si_{0.05}MgB_{14}$ films have been produced by the PLD technique, although some particulates, an artifact of the PLD process, are incorporated into the films. The surface roughness of the 573 K-deposited film was found to be lower than that of the room temperature deposited film. The decrease in surface roughness at higher substrate temperature may be due to an enhanced surface mobility of adatoms, hence increasing the areal density of nucleation sites.

Figure 4A:
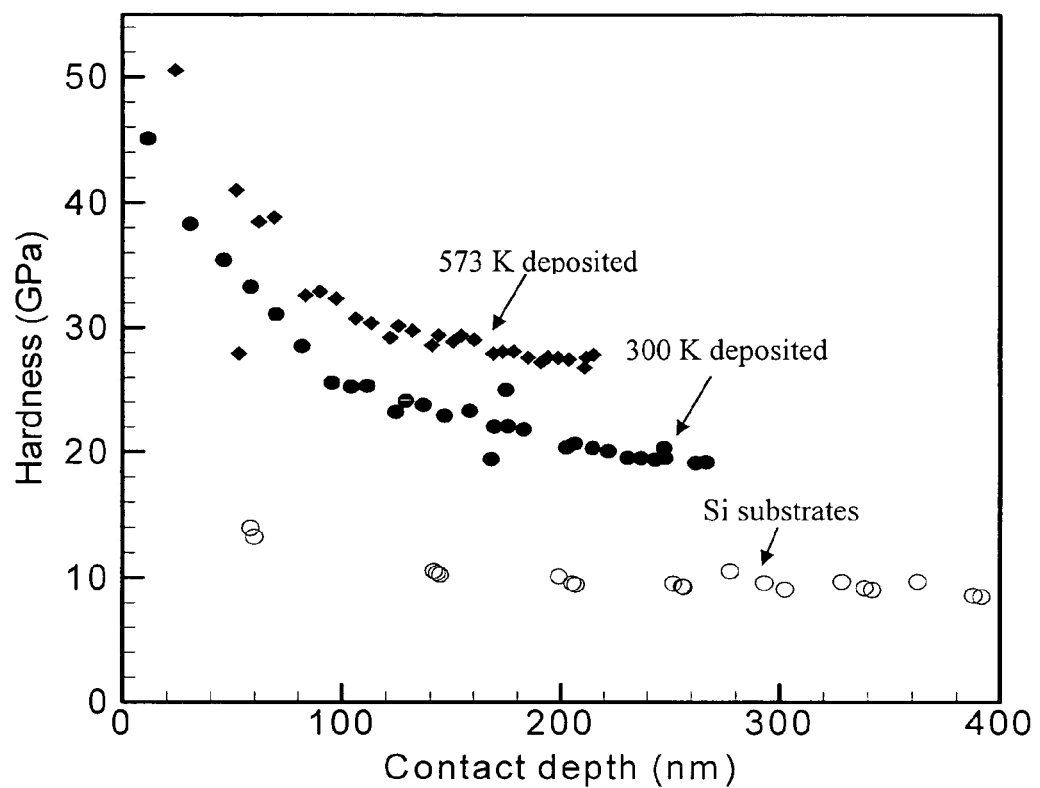
FIGS. 4A and 4B show the hardness and moduli vs. contact depth of room temperature and 573 K-deposited $Al_{0.95}Si_{0.05}MgB_{14}$ films.
Figure 4B:
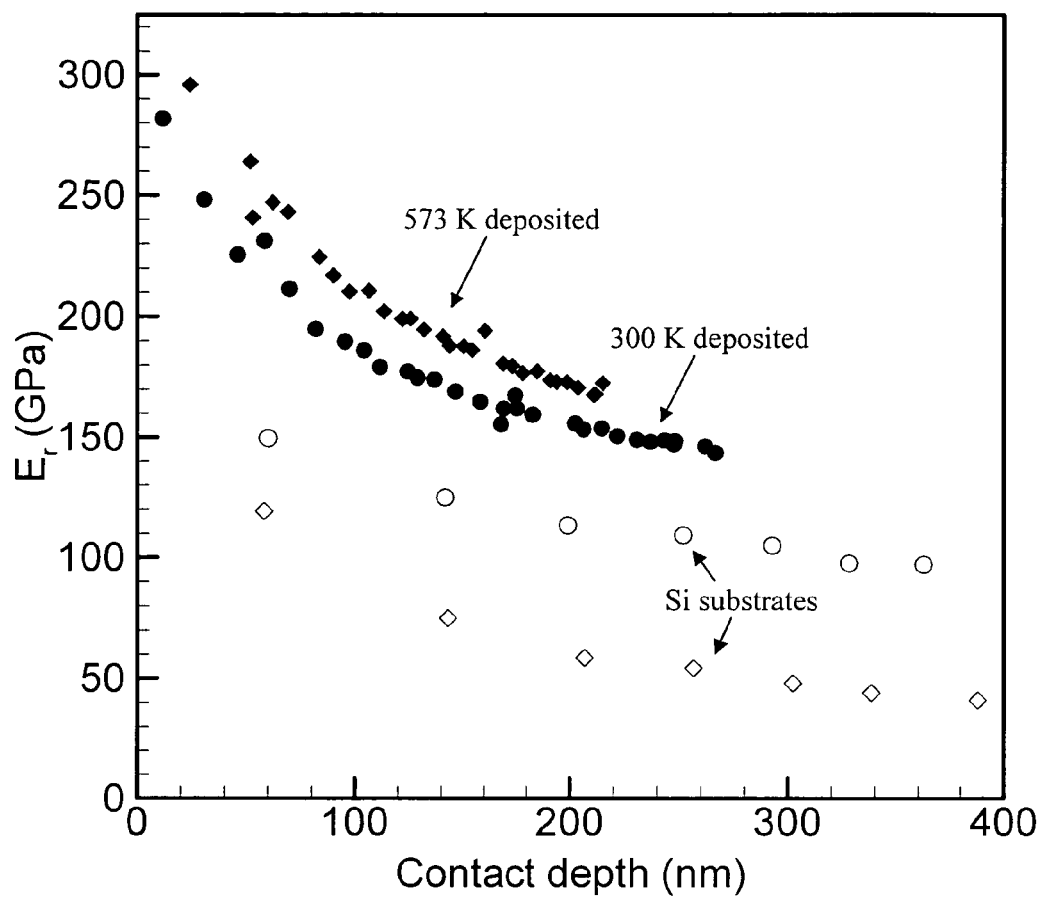

The measured hardness and moduli of the room temperature and 573 K-deposited $Al_{0.95}Si_{0.05}MgB_{14}$ films are plotted in FIG. 4, as a function of indentation contact depth. Both hardness and modulus decrease and approach those of the substrate (Si) with increasing indentation contact depth, exhibiting typical behavior of a hard film on a soft substrate. If the film is harder than the substrate, then most of the plastic deformation would occur within the softer substrate, leading to a "sink-in" effect even if the indenter had not yet penetrated through the film. Since the influence of the substrate rises as the indentation depth increases, in order to determine the hardness of the film alone, a widely accepted rule of thumb calls for limiting the indentation depth to less than 10% to 15% of the film thickness. FIG. 4 shows that the maximum hardness for the room temperature and 573 K-deposited $Al_{0.95}Si_{0.05}MgB_{14}$ films are 45 GPa and 51 GPa respectively; these values correspond to an indentation depth of less than 10% of the film thickness, indicating that these hardness values may be very close to the true hardness of $Al_{0.95}Si_{0.05}MgB_{14}$ films.

Although it cannot be said with certainty how the invention works, it can be said that extraordinarily high hardness has been reported in superlattices and nanocomposite coatings, where interfacial phenomena govern the mechanical properties. Veprek et al. refer to such a microstructural contribution to hardness as "extrinsic hardness". In this work, superhardness of 45 GPa and 51 GPa was achieved for the room temperature and 573 K-deposited $Al_{0.95}Si_{0.05}MgB_{14}$ films; however, it should be noted that such high hardness was essentially obtained in an entirely amorphous structure, in which randomly distributed $B_{12}$ icosahedra dominate according to the FTIR results. This appears to indicate that $AlMgB_{14}$-based films derive their extreme hardness from the covalent, intraicosahedral B—B bonds, and the hardening mechanism for $AlMgB_{14}$-based films should be considered as "intrinsic", which is the case for conventional superhard materials, such as diamond and c-BN. The higher hardness (51 GPa) for the $Al_{0.95}Si_{0.05}MgB_{14}$ film deposited at 573 K may be due to its denser structure and formation of more well-developed $B_{12}$ icosahedra at higher deposition temperatures, as indicated by the FTIR spectra.

The B—B bonding in $B_{12}$ icosahedra in $AlMgB_{14}$-based films is electron deficient, consequently the hardness is expected to be much lower than that of conventional superhard materials, whose crystal structures are typically based upon highly directional, covalent sp$^3$ bonds. In this work, however, a hardness comparable to that of c-BN has been obtained in $AlMgB_{14}$-based films. This anomaly might be associated with the incorporation of metallic dopants (i.e. Al and Mg) in $AlMgB_{14}$-based films. It has been shown by electron density mapping that a substantial number of valence electrons can transfer from metal atoms to the boron framework in the $AlMgB_{14}$-type orthorhombic borides, leading to a full occupancy of valence band of $B_{12}$ icosahedra and thus, much stronger B—B bonds. This effect could be further enhanced in amorphous structures.

The friction coefficients of the room temperature and 573 K-deposited $Al_{0.95}Si_{0.05}MgB_{14}$ films were found to be extremely low, ranging between 0.04 and 0.05. Such low friction behavior can be attributed to the in situ formation of a very lubricious surface layer of boric acid ($H_3BO_3$), which acts as a self-lubricant for $AlMgB_{14}$-based films. Boric acid is an end product of sequential reactions among B, O and $H_2O$ in the air, it is characterized by a layered triclinic crystal structure similar to that of graphite, $MoS_2$, and h-BN, i.e., closely packed H, B and O atoms in each layer are strongly linked to each other by covalent and ionic bonds, whereas weak van der Waals forces prevail between the atomic layers. Hence, when in sliding contact with another solid surface, adjacent atomic layers in boric acid can be easily shear-deformed, which results in a low friction coefficient. Such layered compounds have also been found on the surfaces of $B_4C$ and borided steel.

Figure 5:
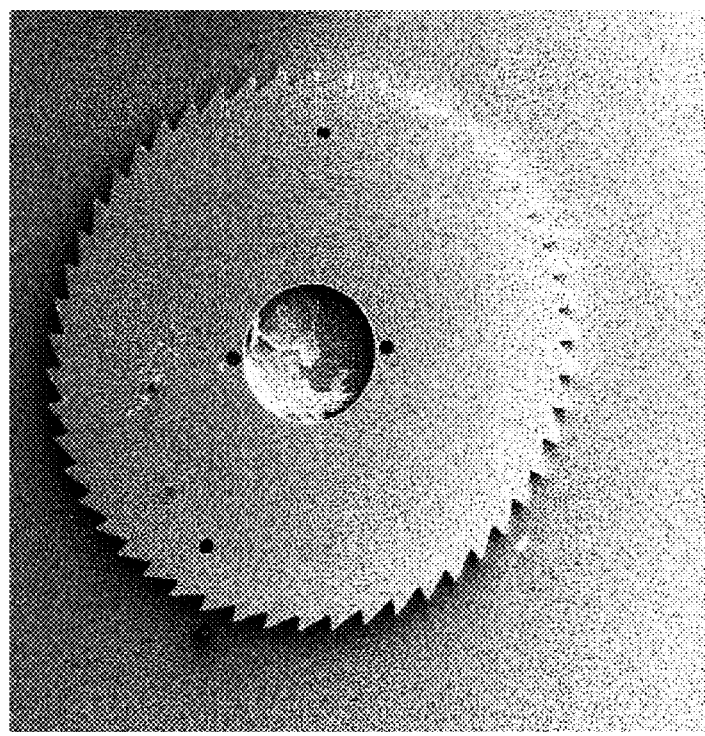
FIG. 5 shows a LIGA nickel component coated with $Al_{0.95}Si_{0.05}MgB_{14}$.

LIGA components have been coated with $Al_{0.95}Si_{0.05}MgB_{14}$. FIG. 5 shows an example of a LIGA nickel component coated with $Al_{0.95}Si_{0.05}MgB_{14}$. The base pressure during deposition of coatings on LIGA components was below $8\times10^{-7}$ Torr. The nanohardness obtained from 20° C. and 300° C. deposited $Al_{0.95}Si_{0.05}MgB_{14}$ films on LIGA components exceeded 40 GPa, corresponding to indentation contact depth of less than 30 nm (all films' thickness ranges between 300 nm and 400 nm for the 6-7 hour deposition times). This indicates the hardness values are very close to the intrinsic hardness of $AlMgB_{14}$ films.

Growth of a superhard, atomically smooth, and self-lubricating $Al_{0.95}Si_{0.05}MgB_{14}$ film by pulsed laser deposition is demonstrated. Remarkable hardness of greater than 40 GPa was obtained from an entirely amorphous structure, this phenomenon can be accounted for based on an electron transfer mechanism from metal atoms present in the film. In particular, $AlMgB$-based$_{14}$ film is useful for protective coatings on LIGA microdevices and Si-based MEMS components.

The substrate used for depositing the layer of the $AlMgB_{14}$ based alloy is not critical and the substrate may be selected from the group consisting of silicon, glass, quartz, aluminum oxide, iron, copper and nickel.

What is claimed is:

1. A method of forming an ultra-hard, low friction coated device comprising the steps of:
   providing a micromachined substrate;
   depositing a layer of $AlMgB_{14}$-based alloy over the micromachined substrate;
   wherein the deposited layer of $AlMgB_{14}$-based alloy contains less than 10 mol % O.

2. The method of claim 1 wherein the depositing is by pulsed laser deposition.

3. The method of claim 1 wherein the depositing is by sputtering.

4. The method of claim 1 wherein the substrate is selected from the group consisting of silicon, glass, quartz, aluminum oxide, iron, copper and nickel.

5. The method of claim 1 wherein the $AlMgB_{14}$-based alloy is selected from the group consisting of $AlMgB_{14}$, $Al_zSi_{1-z}MgB_{14}$, $AlCrMg_{1-z}B_{14}$, $AlTi_zMg_{1-z}B_{14}$ and $AlMgB_{14}X$ where X is present in an amount from 5 wt. % to 30 wt. % and comprises a doping agent selected from the group consisting of Group III, IV and V elements and borides and nitrides thereof and where $1 \geq z \geq 0$.

6. The method of claim 5 wherein the $AlMgB_{14}$-based alloy is $AlMgB_{14}$.

7. The method of claim 5 wherein $AlMgB_{14}$-based alloy is $Al_zSi_{1-z}MgB_{14}$.

8. The method of claim 5 wherein the $AlMgB_{14}$-based alloy is $AlCrMg_{1-z}Mg_{1-z}B_{14}$.

9. An ultra hard, low friction coated device comprising a micromachined substrate with a surface coating of $AlMgB_{14}$-based alloy which contains less than 10 mol % O.

10. The device of claim 9 wherein the $AlMgB_{14}$-based alloy is selected form the group consisting of $AlMgB_{14}$, $Al_zSi_{1-z}MgB_{14}$, $AlCr_zMg_{1-z}B_{14}$, $AlTi_zMg_{1-z}B_{14}$ and $AlMgB_{14}X$ where X is present in an amount from 5 wt. % to 30 wt. % and comprises a doping agent selected from the group consisting of Group m, IV and V elements and borides and nitrides thereof and where $1 \geq z \geq 0$.

11. The device of claim 9 wherein the $AlMgB_{14}$-based alloy is $AlMgB_{14}$.

12. The device of claim 9 wherein the $AlMgB_{14}$-based alloy is $Al_zSi_{1-z}MgB_{14}$.

13. The device of claim 9 wherein the $AlMgB_{14}$-based alloy is $AlCr_zMg_{1-z}B_{14}$.

14. The device of claim 9 wherein the surface coating of $AlMgB_{14}$-based alloy contains less than 5 mol. % O.

* * * * *

UNITED STATES PATENT AND TRADEMARK OFFICE
CERTIFICATE OF CORRECTION

PATENT NO. : 7,238,429 B2
APPLICATION NO. : 10/946051
DATED : July 3, 2007
INVENTOR(S) : Bruce Allen Cook et al.

It is certified that error appears in the above-identified patent and that said Letters Patent is hereby corrected as shown below:

Page 9, Column 2, line 41:
DELETE:
after nitrides thereof and where "$1 \geqq z \geqq 0$"
ADD:
after nitrides thereof and where -- $1 \geq z \geq 0$ --

Page 11, Claim 5, Column 6, line 12:
DELETE:
after nitrides thereof and where "$1 \geqq z \geqq 0$"
ADD:
after nitrides thereof and where -- $1 \geq z \geq 0$ --

Page 11, Claim 5, Column 6, line 16:
DELETE:
after $Al_zSi_{1-z}MgB_{14}$, "$AlCrMg_{1-z}B_{14}$"
ADD:
after $Al_zSi_{1-z}MgB_{14}$, -- $AlCr_zMg_{1-z}B_{14}$ --

Page 11, Claim 8, Column 6, line 22:
DELETE:
after alloy is "$AlCrMg_{1-z}B_{14}$"
ADD:
after alloy is -- $AlCr_zMg_{1-z}B_{14}$ --

Page 11, Claim 10, Column 6, line 31:
DELETE:
after consisting of Group "m"
ADD:
after consisting of Group -- III --

UNITED STATES PATENT AND TRADEMARK OFFICE
CERTIFICATE OF CORRECTION

PATENT NO. : 7,238,429 B2
APPLICATION NO. : 10/946051
DATED : July 3, 2007
INVENTOR(S) : Bruce Allen Cook et al.

It is certified that error appears in the above-identified patent and that said Letters Patent is hereby corrected as shown below:

Page 11, Claim 10, Column 6, line 32:
DELETE:
after nitrides thereof and where "$1 \geqq z \geqq 0$"
ADD:
after nitrides thereof and where -- $1 \geq z \geq 0$ --

Signed and Sealed this

Thirtieth Day of October, 2007

JON W. DUDAS
*Director of the United States Patent and Trademark Office*